United States Patent
Akiyama et al.

(10) Patent No.: US 10,801,112 B2
(45) Date of Patent: Oct. 13, 2020

(54) COMPOSITION FOR FORMING COATING, PRODUCTION METHOD FOR SURFACE-TREATED METAL MEMBER, AND PRODUCTION METHOD FOR METAL-RESIN COMPOSITE

(71) Applicant: MEC COMPANY LTD., Hyogo (JP)

(72) Inventors: Daisaku Akiyama, Hyogo (JP); Itsuro Tomatsu, Hyogo (JP); Yasutaka Amitani, Hyogo (JP); Keisuke Joko, Hyogo (JP); Tokuya Satomi, Hyogo (JP)

(73) Assignee: MEC COMPANY LTD., Hyogo (JP)

( * ) Notice: Subject to any disclaimer, the term of this patent is extended or adjusted under 35 U.S.C. 154(b) by 0 days.

(21) Appl. No.: 16/471,126

(22) PCT Filed: Dec. 15, 2017

(86) PCT No.: PCT/JP2017/045225
§ 371 (c)(1),
(2) Date: Jun. 19, 2019

(87) PCT Pub. No.: WO2018/135203
PCT Pub. Date: Jul. 26, 2018

(65) Prior Publication Data
US 2020/0040460 A1 Feb. 6, 2020

(30) Foreign Application Priority Data

Jan. 21, 2017 (JP) .................... 2017-009033

(51) Int. Cl.
*C23C 22/05* (2006.01)
*B32B 15/08* (2006.01)
(Continued)

(52) U.S. Cl.
CPC .............. *C23C 22/05* (2013.01); *B32B 15/08* (2013.01); *B32B 15/20* (2013.01); *B32B 37/12* (2013.01); *C08J 5/12* (2013.01); *C23C 22/182* (2013.01)

(58) Field of Classification Search
CPC ....................................................... C23C 22/05
See application file for complete search history.

(56) References Cited

U.S. PATENT DOCUMENTS

| 4,051,057 | A  | 9/1977 | Ericson et al. |
| 6,372,027 | B1 | 4/2002 | Totnaluolo et al. |

(Continued)

FOREIGN PATENT DOCUMENTS

| JP | 51-86030  | 7/1976  |
| JP | 7-258870  | 10/1995 |

(Continued)

OTHER PUBLICATIONS

Notification of Transmittal of Copies of Translation of the International Preliminary Report on Patentability issued Jul. 23, 2019 in International (PCT) Application No. PCT/JP2017/045225, with English translation.

(Continued)

*Primary Examiner* — Daniel H Lee
(74) *Attorney, Agent, or Firm* — Wenderoth, Lind & Ponack, L.L.P.

(57) ABSTRACT

The coating film-forming composition is a solution of pH 4 to 10 and includes an aromatic compound having an amino group and an aromatic ring in one molecule, a polybasic acid having two or more carboxy groups, and an oxidizing agent. As the oxidizing agent, hypochlorous acid, chlorous acid, chloric acid, perchloric acid, persulfuric acid, percarbonic acid, hydrogen peroxide, organic peroxides, or the like is used. The aromatic compound preferably contains a nitrogen-containing aromatic ring, and more preferably contains a primary amino group or a secondary amino group. The coating film-forming composition is used for, for example, forming a coating film on surface of a metal member.

14 Claims, 1 Drawing Sheet

(51) Int. Cl.
  *B32B 15/20* (2006.01)
  *B32B 37/12* (2006.01)
  *C08J 5/12* (2006.01)
  *C23C 22/18* (2006.01)

(56) References Cited

U.S. PATENT DOCUMENTS

| | | | |
|---|---|---|---|
| 6,475,299 B1* | 11/2002 | Lee | C08G 77/02 |
| | | | 106/14.13 |
| 2010/0288731 A1 | 11/2010 | Wunderlich et al. | |
| 2012/0193773 A1* | 8/2012 | Kapadia | C09J 5/02 |
| | | | 257/666 |
| 2012/0260821 A1* | 10/2012 | Sengoku | C23C 18/1689 |
| | | | 106/287.2 |
| 2015/0152124 A1 | 6/2015 | Mori et al. | |
| 2016/0368935 A1 | 12/2016 | Miura et al. | |

FOREIGN PATENT DOCUMENTS

| | | |
|---|---|---|
| JP | 2000-286546 | 10/2000 |
| JP | 2001-64780 | 3/2001 |
| JP | 2012-224895 | 11/2012 |
| JP | 2014-510835 | 5/2014 |
| JP | 2015-143395 | 8/2015 |
| JP | 2015-214743 | 12/2015 |
| KR | 10-2004-0058037 | 7/2004 |
| KR | 10-2006-0017852 | 2/2006 |
| KR | 20060017852 A * | 2/2006 |
| WO | 2007/093284 | 8/2007 |
| WO | 2013/186941 | 12/2013 |

OTHER PUBLICATIONS

International Search Report dated Jan. 30, 2018 in International Application No. PCT/JP2017/045225, with English.
Written Opinion of the International Searching Authority dated Jan. 30, 2018 in International Application No. PCT/JP2017/045225, with English translation.
Extended European Search Report dated Dec. 19, 2019 in corresponding European Patent Application No. 17893423.8.

* cited by examiner

FIG. 1

FIG. 2

COMPOSITION FOR FORMING COATING, PRODUCTION METHOD FOR SURFACE-TREATED METAL MEMBER, AND PRODUCTION METHOD FOR METAL-RESIN COMPOSITE

TECHNICAL FIELD

The present invention relates to a coating film-forming composition for forming a coating film on a surface of a metal member for improving adhesion to a resin. Further, the present invention relates to a method for producing a surface-treated metal member using the coating film-forming composition, and also to a method for producing a metal-resin composite.

BACKGROUND ART

In the printed wiring board production process, a resin material such as an etching resist, a plating resist, a solder resist, or a prepreg is joined to the surface of a metal layer or a metal wiring. In the printed wiring board production process and also in the produced products, high adhesion is required between the metal and the resin. Examples of the known method for improving adhesion between a metal and a resin are the followings: forming fine irregularities on a metal surface using a roughening agent (microetching agent); forming a coating film for improving adhesion to a resin (adhesive layer) on the surface of a metal; forming an adhesive layer on a roughened surface.

For example, Patent Document 1 discloses that a surface of a leadframe made of a copper alloy is roughened with an acidic aqueous solution including a nitrogen-containing heterocyclic compound, sulfuric acid, hydrogen peroxide as an oxidizing agent, and specific amounts of fluoride ion and chloride ion, thereby improving adhesion to a resin. Patent Document 2 discloses that an adhesion between the copper wiring and an epoxy resin can be improved when the surface of a copper wiring is subjected to a roughening treatment with an acidic aqueous solution containing copper ion, and then treated with an aqueous solution containing an organic acid, a benzotriazole-based antirust agent, and a silane coupling agent. Patent Document 3 and Patent Document 4 disclose that an adhesion between the metal and a resin can be improved by bringing a solution containing a specific silane compound into contact with the metal surface to form a coating film. Patent Document 5 discloses that an adhesion between the metal and a resin can be improved by applying an antirust agent containing a triazole-based compound, a silane coupling agent, and an organic acid to the copper foil surface.

PRIOR ART DOCUMENTS

Patent Documents

Patent Document 1: WO 2007/093284 A
Patent Document 2: JP 2000-286546 A
Patent Document 3: JP 2015-214743 A
Patent Document 4: WO 2013/186941
Patent Document 5: JP 7-258870 A

SUMMARY OF THE INVENTION

Problems to be Solved by the Invention

Depending on the kind of resin, the method for roughening a surface of a metal layer as described in Patent Document 1 may not offer sufficient adhesion. In addition, in order to enhance adhesion to a resin, it is necessary to increase the etching depth (e.g., in the Examples of Patent Document 1, the surface of copper is etched 1 μm or more). Therefore, in the case where the method is applied to a metal wiring of a printed wiring board, remarkable thinning of the wiring is caused, and adoption to wiring microfabrication (fine pitch) is limited.

According to the method for forming a coating film on a surface of a metal layer using a composition containing a silane coupling agent as described in Patent Documents 2 to 5, it is not necessary to dispose an additional metal layer (e.g., tin-plated layer) for improving adhesion, so that the process of joining a metal and a resin can be simplified. However, in the conventional compositions, the film adhesion on a metal surface is poor, and thus the adhesion between a metal and a resin may be insufficient. In addition, in order to sufficiently improve adhesion to a resin, it is necessary to increase the time period of contact between a coating film-forming composition (solution) and a metal, or form a coating film by drying the solvent under the condition where the solution is attaching to the surface of a metal. Accordingly, it cannot be said that the film formability is sufficient.

In view of the above background, an object of the present invention is to provide a coating film-forming composition that is capable of forming a coating film having excellent adhesion to a resin on a metal surface in a short period of time.

Means for Solving the Problems

As a result of research, the present inventors have found that a composition containing a specific aromatic compound, a polybasic acid, and an oxidizing agent has excellent film formability on a metal surface, is capable of significantly improving metal-resin adhesion, and is also excellent in terms of solution stability.

The coating film-forming composition of the present invention contains an aromatic compound having an amino group and an aromatic ring in one molecule, a polybasic acid having two or more carboxy groups, and an oxidizing agent, and is a solution having a pH of 4 to 10. Examples of oxidizing agents include hypochlorous acid, chlorous acid, chloric acid, perchloric acid, permanganic acid, persulfuric acid, percarbonic acid, hydrogen peroxide, organic peroxides, and salts thereof. The content of the oxidizing agent in the coating film-forming composition is preferably 0.01 to 0.9 wt %.

By bringing the coating film-forming composition described above into contact with a surface of a metal member, a coating film is formed on the metal member surface. The surface-treated metal member having a coating film formed thereon has excellent adhesion to a resin. The metal member may be a copper or copper alloy material.

Effects of the Invention

An adhesion between a metal member and a resin can be improved by forming a coating film on a surface of the metal member, such as copper or a copper alloy, using the coating film-forming composition of the present invention. When the metal member and a resin are joined together with the coating film therebetween, a metal-resin composite with an excellent adhesion can be obtained.

MODE FOR CARRYING OUT THE INVENTION

[Coating Film-Forming Composition]

The coating film-forming composition of the present invention is used for forming a coating film on a metal surface. The coating film-forming composition is a solution of pH 4 to 10, and contains an aromatic compound having an amino group and an aromatic ring in one molecule, a polybasic acid, and an oxidizing agent. Hereinafter, each component contained in the coating film-forming composition of the present invention will be described.

<Aromatic Compound>

The aromatic compound is a material that serves as a main component of a coating film. The aromatic compound has an amino group and an aromatic ring in one molecule.

The aromatic ring may be composed only of carbon and hydrogen, or may also be a heteroaromatic ring containing a heteroatom such as nitrogen, oxygen, or sulfur. The aromatic ring may be monocyclic or condensed polycyclic. It is preferable that the aromatic compound contains a nitrogen-containing aromatic ring. Examples of nitrogen-containing aromatic rings include monocyclic rings such as pyrrole, pyrazole, imidazole, triazole, tetrazole, oxazole, oxadiazole, isoxazole, thiazole, isothiazole, furazane, pyridine, pyridazine, pyrimidine, pyrazine, triazine, tetrazine, pentazine, azepine, diazepine, and triazepine; condensed bicyclic rings such as indole, isoindole, thienoindole, indazole, purine, quinoline, isoquinoline, and benzotriazole; condensed tricyclic rings such as carbazole, acridine, 3-carboline, acridone, perimizine, phenazine, phenanthridine, phenothiazine, phenoxazine, and phenanthroline; condensed tetracyclic rings such as quindoline and quinindoline; and condensed pentacyclic rings such as acrindoline. Among them, nitrogen-containing aromatic rings containing two or more nitrogen atoms, such as pyrazole, imidazole, triazole, tetrazole, pyridazine, pyrimidine, pyrazine, triazine, tetrazine, and pentazine, are preferable, and imidazole, triazole, and triazine are particularly preferable.

The amino group may be primary, secondary, or tertiary, or may also be heterocyclic. The amino group may be directly or indirectly bonded to the aromatic ring. The aromatic compound may have two or more amino groups in one molecule. A nitrogen-containing aromatic ring corresponds to both a heterocyclic amino group and an aromatic ring. Therefore, in the case where the above aromatic ring is a nitrogen-containing aromatic ring, an amino group does not have to be contained separately from the aromatic ring. The aromatic compound preferably has a secondary amino group and/or a primary amino group, and particularly preferably has a primary amino group. Because a coating film having excellent adhesion between a metal and a resin can be formed, it is preferable that the aromatic compound is a compound having a nitrogen-containing aromatic ring and having a primary amino group indirectly bonded to the nitrogen-containing aromatic ring through an alkylene group, an alkylene amino group, or the like.

The aromatic compound is not particularly limited in structure as long as it has an aromatic ring and an amino group, and may also have a functional group other than the amino group, such as a hydroxy group, a carboxy group, an amide group, a cyano group, a nitro group, an azo group, a diazo group, a mercapto group, an epoxy group, a silyl group, a silanol group, or an alkoxysilyl group. In particular, in the case where the aromatic compound has an alkoxysilyl group or a hydroxysilyl group, the aromatic compound has a function as a silane coupling agent, and thus the adhesion between a metal and a resin is likely to improve.

Among the above examples, it is preferable that the aromatic compound has, outside the aromatic ring, at least one functional group selected from the group consisting of a primary amino group, a secondary amino group, an alkoxysilyl group, and a hydroxysilyl group. The aromatic compound preferably contains a nitrogen-containing aromatic ring, and a nitrogen-containing aromatic ring containing two or more nitrogen atoms is particularly preferable. In the case where the aromatic ring of the aromatic compound contains no nitrogen atom, it is preferable that the aromatic compound contains an alkoxysilyl group or a hydroxysilyl group outside the aromatic ring.

When the aromatic compound has a high molecular weight, the solubility in water or an organic solvent may decrease, or the adhesion of the coating film to a metal surface may decrease. Therefore, the molecular weight of the aromatic compound is preferably 1,500 or less, more preferably 1,200 or less, and still more preferably 1,000 or less.

(Specific Examples of Aromatic Compound)

As examples of the aromatic compound, imidazole silane compounds represented by the following general formulae (I) and (II) can be mentioned (e.g., JP 2015-214743 A).

(I)

(II)

$R^{11}$ to $R^{15}$ in general formulae (I) and (II) are each independently a hydrogen atom or a $C_{1-20}$ alkyl group, an allyl group, a benzyl group, or an aryl group. $R^{21}$ and $R^{22}$ each independently represent a hydrogen atom, a $C_{1-4}$ alkyl group, a hydroxy group, or a methoxy group, and p is an integer of 0 to 16. $R^{31}$ is a primary amino group ($—NH_2$) or an alkoxysilyl group or hydroxysilyl group represented by $—Si(OR^{41})_k R^{42}_{(3-k)}$ (k is an integer of 1 to 3, and $R^{41}$ and $R^{42}$ are each independently a hydrogen atom or a $C_{1-6}$ alkyl group).

As represented by the following general formula (III), a silane compound having a triazole ring as a nitrogen-containing aromatic ring may also be suitably used as the aromatic compound (e.g., JP 2016-56449 A).

(III)

$R^{21}$, $R^{22}$, $R^{31}$, and p in general formula (III) are as defined for the above general formulae (I) and (II). $R^{16}$ is a hydrogen atom, a $C_{1-20}$ alkyl group, an allyl group, a benzyl group, or an aryl group. X is a hydrogen atom, a methyl group, $-NH_2$, $-SH$, or $-SCH_3$, and particularly preferably $-NH_2$.

As the aromatic compound, a compound having a triazine ring may also be suitably used. The following general formula (IV) is an example of the aromatic compound having a triazine ring and an amino group, wherein substituents are present on 2-, 4-, and 6-positions of 1,3,5-triazine, and at least one of them has a terminal amino group.

(IV)

In the above general formula (IV), $R^{50}$, $R^{51}$, $R^{52}$, $R^{60}$, and $R^{61}$ are each independently an arbitrary divalent group, such as a substituted or unsubstituted alkylene group optionally having a $C_{1-6}$ branch. The alkylene group may contain ether, carbonyl, carboxy, amide, imide, carbamide, carbamate, or the like at the terminal or between carbons. $Z^1$ is the same group as Z. m and n are each independently an integer of 0 to 6. The terminal group A is a hydrogen atom, a primary amino group ($-NH_2$), or an alkoxysilyl group or hydroxysilyl group represented by $-Si(OR^{41})_k R^{42}_{(3-k)}$ (k is an integer of 1 to 3, and $R^{41}$ and $R^{42}$ are each independently a hydrogen atom or a $C_{1-6}$ alkyl group).

A compound of general formula (IV) wherein two Zs are each m=0, and the terminal group A is an amino group, is represented by the following formula (V).

(V)

The compound of the above general formula (V) is obtained, for example, by allowing cyanuric halide to react with three molar equivalents of an alkylene diamine. In the case where one amino group of the alkylene diamine reacts with cyanuric halide, while the other amino group remains unreacted, as in the above formula (V), a derivative having an amino group at the terminal is obtained. When both of the amino groups of the alkylene diamine react with cyanuric halide, an aromatic compound having a plurality of triazine rings (a compound wherein m in Z is 1 or more) is produced.

When the polymerization degree of the triazine derivative represented by the above general formula (IV) increases, the solubility in water or an organic solvent may decrease. Therefore, in the synthesis of a triazine derivative having an amino group at the terminal, it is preferable to use an excess of alkylene diamine relative to cyanuric halide.

A compound of general formula (IV) wherein one of the two Zs is m=0, and the terminal group A is an amino group, while the other Z is m=0, and the terminal group A is a trialkoxysilyl group, is represented by the following formula (VI).

(VI)

The compound represented by the above general formula (VI) is a silane coupling agent having a triazine ring and an amino group, and can be obtained by the method described in WO 2013/186941, for example.

As an aromatic compound having a triazine ring, in addition to those mentioned above, as represented by the following general formulae (VII) and (VIII), a compound wherein an alkylenethio group is bonded to a triazine ring can be mentioned (e.g., JP 2016-37457 A), for example.

(VII)

(VIII)

In the above general formulae (VII) and (VIII), $R^{21}$ to $R^{24}$ each independently represent a hydrogen atom, a $C_{1-4}$ alkyl group, a hydroxy group, or a methoxy group. $R^{31}$ is a primary amino group ($-NH_2$) or an alkoxysilyl group or hydroxysilyl group represented by $-Si(OR^{41})_k R^{42}_{(3-k)}$ (k is an integer of 1 to 3, and $R^{41}$ and $R^{42}$ are each independently a hydrogen atom or a $C_{1-6}$ alkyl group). p is an integer of 0 to 16, and q is 1 or 2.

Although a silane compound having an imidazole ring, a silane compound having a triazole ring, and a compound having a triazine ring have been mentioned as examples of the aromatic compound, the aromatic compound in the coating film-forming composition is not limited to the example compounds mentioned above, as long as it has an amino group and an aromatic ring in one molecule.

(Content of Aromatic Compound)

The content of the aromatic compound in the coating film-forming composition is not particularly limited. In terms of improving film formability on a metal surface, the content of the aromatic compound is preferably 0.01 to 10 wt %, more preferably 0.03 to 7 wt %, and still more preferably 0.05 to 5 wt %.

<Polybasic Acid>

The polybasic acid functions to promote film formation together with oxidizing agent and also contributes to the improvement in adhesion between a metal layer and a resin. A polybasic acid is capable of forming a chelate with a small amount of metal ion eluted into the solution, and thus can suppress the precipitation of insoluble matter in the solution that accompanies binding between the metal ion and the aromatic compound.

The polybasic acid in the coating film-forming composition of the present invention is an organic acid having two or more carboxy groups. Examples of the polybasic acid include dicarboxylic acids such as oxalic acid, malonic acid, methylmalonic acid, succinic acid, methylsuccinic acid, glutaric acid, adipic acid, pimelic acid, suberic acid, azelaic acid, sebacic acid, hexafluoroglutaric acid, maleic acid, tartaric acid, diglycolic acid, phthalic acid, isophthalic acid, terephthalic acid, homophthalic acid, malic acid, 3,6-dioxaoctanedicarboxylic acid, mercaptosuccinic acid, thiodiglycolic acid, 1,2-phenylenedioxydiacetic acid, 1,2-phenylenediacetic acid, 1,3-phenylenediacetic acid, 1,4-phenylenediacetic acid, 1,4-phenylenedipropionic acid, and 4-carboxyphenoxyacetic acid; tricarboxylic acids such as citric acid, 1,2,3-propanetricarboxylic acid, 1,2,3-benzenetricarboxylic acid, 1,2,4-benzenetricarboxylic acid, 1,3,5-benzenetricarboxylic acid, 1,3,5-cyclohexanetricarboxylic acid, and 1-propene-1,2,3-tricarboxylic acid; tetracarboxylic acids such as 1,2,3,4-butanetetracarboxylic acid, tetrahydrofuran-2,3,4,5-tetracarboxylic acid, 1,2,4,5-benzenetetracarboxylic acid, 1,4,5,8-naphthalenetetracarboxylic acid, 1,2,3,4-cyclobutanetetracarboxylic acid, and 1,2,3,4-butanetetracarboxylic acid; and hexacarboxylic acids such as 1,2,3,4,5,6-cyclohexanehexacarboxylic acid and mellitic acid. Among them, divalent carboxylic acids (dicarboxylic acids), such as malonic acid and maleic acid, are preferable.

The content of the polybasic acid in the coating film-forming composition is preferably 0.03 to 25 times, more preferably 0.05 to 20 time, and still more preferably 0.1 to 15 times the content of the above aromatic compound on a weight basis. When the content ratio between the aromatic compound and the polybasic acid is within the above range, a coating film having excellent adhesion to a resin can be formed on a metal surface.

<Oxidizing Agent>

An oxidizing agent is a component that promotes coating film formation on a metal surface. In a conventional coating film-forming agent, generally, drying is performed to form a film with a solution containing a silane coupling agent or the like attaching to a metal surface. In contrast, because the coating film-forming composition of the present invention contains an oxidizing agent, at the time when the solution contacts a metal surface, the metal surface is oxidized by the action of the oxidizing agent, and the interaction between the metal and the aromatic compound is enhanced. As a result, the formation of a coating film is promoted.

Examples of oxidizing agents include hypochlorous acid, chlorous acid, chloric acid, perchloric acid, permanganic acid, persulfuric acid, percarbonic acid, hydrogen peroxide, organic peroxides, and salts thereof. Examples of salts include sodium salts, potassium salts, and ammonium salts. Among them, for the excellent properties of promoting the formation of a coating film, as oxidizing agents, chlorites, chlorates, persulfates, percarbonates, and hydrogen peroxides are preferable. Specifically, sodium chlorite, sodium chlorate, sodium persulfate, ammonium persulfate, sodium percarbonate, and hydrogen peroxide are preferable. Among them, for the high stability in an aqueous solution, sodium hypochlorite and sodium chlorite are particularly preferable.

In terms of enhancing the film formability on a metal surface and reducing the time period required for coating film formation, the content of the oxidizing agent in the coating film-forming composition is preferably 0.01 wt % or more, more preferably 0.03 wt % or more, and still more preferably 0.05 wt % or more.

Meanwhile, when the content of the oxidizing agent is too high, the dissolution of the metal by the oxidizing agent takes precedence over the formation of a coating film on a metal surface, whereby the etching of the metal surface may advance. In addition, when the content of the oxidizing agent is high, the stability of the solution decreases, and the film formability may decrease with time after the preparation of the solution. Therefore, the content of the oxidizing agent in the coating film-forming composition is preferably 0.9 wt % or less, more preferably 0.7 wt % or less, and still more preferably 0.6 wt % or less. In the case where two or more kinds of oxidizing agents are used, it is preferable that the total of the oxidizing agent contents is within the above range.

When a metal contacts a solution containing the aromatic compound and the oxidizing agent, presumably, the oxidation of the metal by the oxidizing agent and the formation of a coating film by the aromatic compound occur competitively. Once a coating film of the aromatic compound is formed on a surface of the metal, the dissolution action of the oxidizing agent on the metal surface decreases, and thus the formation of a coating film is further promoted. In the case where the content of the oxidizing agent relative to the aromatic compound is excessively low, the oxidizing agent does not sufficiently act on a metal surface, and thus the film formability tends to be poor. On the other hand, when the content of the oxidizing agent relative to the aromatic compound is excessively high, the dissolution (etching) of the metal by the oxidizing agent tends to take precedence over the formation of a coating film. Therefore, the content of the oxidizing agent in the coating film-forming composition is preferably 0.005 to 5 times, more preferably 0.01 to 3 times, still more preferably 0.05 to 2 times, and particularly preferably 0.1 to 1.5 times the content of the aromatic compound on a weight basis.

<Solvent>

The coating film-forming composition of the present invention is prepared by dissolving the above components in a solvent. The solvent is not particularly limited as long as the above components can be dissolved, and water, alcohols such as ethanol and isopropyl alcohol, esters, ethers, ketones, aromatic hydrocarbons, and the like may be used. As water, water from which ionic matters and impurities have been removed is preferable. For example, ion exchange water, pure water, ultrapure water, and the like are preferably used.

<Other Components>

The coating film-forming composition of the present invention may also contain components other than those mentioned above. Examples of other components include halide ions, chelating agents, silane coupling agents, pH adjusting agents, surfactants, and stabilizing agents.

In the case where the coating film-forming composition contains a halide ion in addition to the oxidizing agent, the film formability on a metal surface tends to improve. Specific examples of halide ions include chloride ion, bromide ion, and iodide ion. For the excellent properties of promoting the formation of a coating film as a result of combined use with an oxidizing agent, chloride ion is particularly preferable among halide ions. Examples of halide ion sources include hydrohalic acids such as hydrochloric acid and hydrobromic acid; sodium chloride, calcium chloride, potassium chloride, ammonium chloride, potassium bromide, sodium bromide, potassium iodide, sodium iodide, copper chloride, copper bromide, zinc chloride, iron chloride, and tin bromide. It is also possible to use two or more kinds of halide ion sources together. In terms of enhancing film formability, the halide ion concentration is preferably 5 to 600 mM, more preferably 10 to 400 mM, and still more preferably 20 to 200 mM.

When the coating film-forming composition contains a chelating agent to a metal, a chelate is formed with a small amount of metal ion eluted into the solution. Accordingly, the precipitation of insoluble matter in the solution that accompanies binding between the metal ion and the aromatic compound can be suppressed. Incidentally, as described above, a polybasic acid is capable of binding a metal ion and a chelate. Therefore, even in the case where no chelating agent is contained, the coating film-forming composition of the present invention can suppress the precipitation of insoluble matter due to binding between a metal ion and an aromatic compound.

In the case where the above aromatic compound does not have an alkoxysilyl group (ie., in the case where the aromatic compound is not a silane coupling agent), the adhesion between a metal surface and a resin tends to improve when a silane coupling agent is contained as an additive in the coating film-forming composition. Also in the case where the above aromatic compound is a silane coupling agent, another silane coupling agent may be contained as an additive in the coating film-forming composition.

The pH of the coating film-forming composition of the present invention is 4 to 10. When the pH is 4 or more, the etching of the metal surface due to the actions of the oxidizing agent and the acid is suppressed, and the film formability can be improved. In addition, when the pH is within the above range, the degradation of the oxidizing agent in the solution (decomposition, etc.) is unlikely to occur, and the solution can be used continuously or repeatedly for a long period of time after preparation. Therefore, the frequency of replacement or concentration adjustment of the solution is low, and the productivity can be improved. The pH of the coating film-forming composition is preferably 5 to 9. As a pH adjuster, various acids and alkalis may be used without particular limitation.

In the case where the above aromatic compound is a silane coupling agent having an alkoxysilyl group, the silane coupling agent may be partially or completely condensed in the coating film-forming composition of neutral pH range. However, when the condensation excessively proceeds, the silane coupling agent may be precipitated, resulting in a decrease in film formability. Therefore, even in the case where the silane coupling agent is condensed, the weight average molecular weight is preferably 1,500 or less, more preferably 1,200 or less, and still more preferably 1,000 or less, and it is preferable that the condensation degree is suppressed so that the weight average molecular weight will be within this range.

[Formation of Coating Film on Metal Member Surface]

Figure 1:
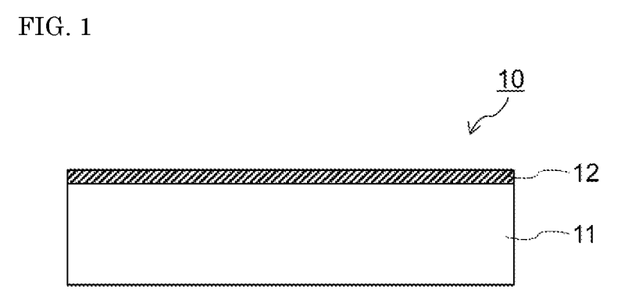
FIG. 1 is a schematic cross-sectional view showing one embodiment of a surface-treated metal member.

The above coating film-forming composition is brought into contact with a surface of a metal member, and the solvent is removed by drying as necessary. As a result, as shown in FIG. 1, a coating film 12 is formed on a surface of the metal member 11. The coating film 12 is a film for improving adhesion to a resin. When the coating film is disposed on a surface of a metal member, the adhesion between the metal member and a resin improves.

Examples of metal members include the surface of a copper foil (electrolytic copper foil, rolled copper foil) used for electronic components such as semiconductor wafers, electronic substrates, and leadframes, decorative items, building materials, and the like, the surface of a copper-plated film (electroless copper-plated film, electrolytic copper-plated film), and also wire-shaped, rod-shaped, tube-shaped, and plate-shaped copper materials for various applications. In particular, the coating film-forming composition of the present invention has excellent film formability on a copper or copper alloy surface. Therefore, as the metal member, it is preferable to use a copper foil, a copper-plated film, a copper material, or the like.

The surface of the metal member may be smooth or may be roughened. When a coating film is formed using the coating film-forming composition of the present invention on a roughened surface of a metal member, the adhesion to a resin can be further improved.

The formation of a coating film on a surface of a metal member is performed under the following conditions, for example.

First, a surface of the metal member is washed with an acid or the like. Next, the metal surface is immersed in the above coating film-forming composition and subjected to an immersion treatment for about 2 second to 5 minutes. The temperature of the solution at this time is preferably about 10 to 50° C., and more preferably about 15 to 35° C. In the immersion treatment, shaking may be performed as necessary. Subsequently, the solution attaching to the metal surface is removed by drying, rinsing, etc. whereby a surface-treated metal member 10 having a coating film 12 on a surface of the metal member 11 is obtained.

As described above, in the case of a conventional coating film-forming composition, it is necessary that after the immersion treatment of a metal member, air-drying is performed under the condition where the solution is attaching to the surface of a metal member, and the solution is concentrated/dried to form a coating film. In contrast, in the case of the coating film-forming composition of the present invention, because of the action of the oxidizing agent, even during immersion in the solution (when not in contact with air), coating film formation on a metal surface is promoted. Accordingly, even in the case where the solution attaching to the metal surface is removed by rinsing with water or the like after immersion in the solution without performing air-drying or the like under the condition where the solution is attaching to the metal surface, a coating film having excellent adhesion to a resin can be uniformly formed on the metal surface. In the case where drying in air is performed with the solution attaching to the metal surface, a coating film having excellent adhesion to a resin can be formed on the metal surface even by a short-time drying treatment. Accordingly, the time period required for coating film formation on a metal surface can be reduced, and also the process of coating film formation can be simplified.

By using the coating film-forming composition of the present invention, even when the time from when the coating film-forming composition is brought into contact with a surface of a metal member by immersion, spraying, or the like to when the solution attaching to the surface of the metal member is removed by rinsing with water or the like (in the case of immersion, the time from the removal of a metal member from the solution to rinsing; in the case of spraying, the time from the completion of spraying to rinsing) is 2 minutes or less, a coating film having excellent adhesion to a resin can be formed on the metal surface. In terms of improving the production efficiency, the time from when the coating film-forming composition is brought into contact with a surface of a metal member to when the solution attaching to the surface of the metal member is removed (rinsing) is more preferably 1.5 minutes or less, and still more preferably 1 minute or less.

As described above, the coating film-forming composition of the present invention is excellent in terms of forming a coating film in a solution and also has high adsorptivity on a metal surface. Therefore, a coating film can be formed on a metal surface even only by an immersion treatment, and even when the solution is removed by rinsing the metal surface without air-drying after immersion, coating film formation state on the metal surface is maintained. In addition, in the case where the coating film-forming composition is applied to a composite member of a metal and another material, a coating film can be selectively formed on a surface of the metal.

Although the coating film 12 is formed only on one side of the plate-shaped metal member 11 in FIG. 1, the coating film may also be formed on both sides of a metal member. It is preferable that the coating film is formed over the entire surface joined to a resin. The method for forming a coating film on a surface of a metal member is not limited to the immersion method, and it is possible to select a suitable application method such as spraying or bar coating.

At the time of coating film formation, it is preferable that the metal surface is not etched. Specifically, the etching amount of the metal surface at the time of coating film formation is preferably 0.5 µm or less, more preferably 0.3 µm or less, and still more preferably 0.2 µm or less. When the pH of the coating film-forming composition is 4 or more as described above, the etching of the metal surface due to the contact with the solution can be suppressed.

[Metal-Resin Composite]

Figure 2:
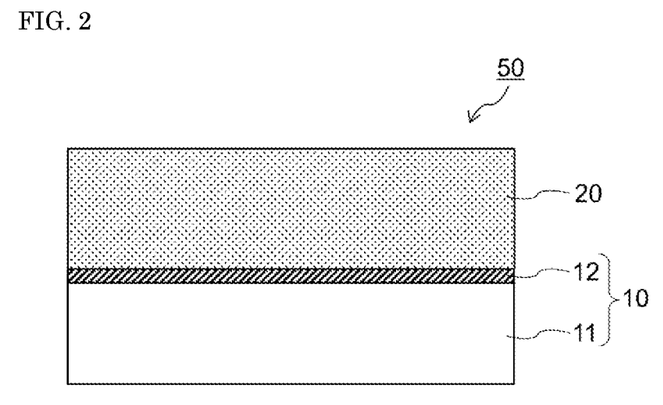
FIG. 2 is a schematic cross-sectional view showing one embodiment of a metal-resin composite.

Onto the coating film 12-formed surface of the surface-treated metal member 10, a resin member 20 is joined, whereby a metal-resin composite 50 shown in FIG. 2 is obtained. Although the resin member (resin layer) 20 is stacked only on one side of the plate-shaped metal member 11 with the coating film 12 therebetween in FIG. 2, the resin member may also be joined on both sides of a metal member.

As the method for joining the surface-treated metal member 10 and the resin member 20 together, it is possible to employ a method such as lamination pressing, lamination, coating, injection molding, or transfer molding. For example, by laminating a resin layer on a copper layer or copper alloy layer surface with an adhesive layer therebetween, a metal-resin laminate for use as a printed wiring board or the like is obtained.

The resin forming the above resin member is not particularly limited, and examples thereof include thermoplastic resins such as acrylonitrile/styrene copolymer resin (AS resin), acrylonitrile/butadiene/styrene copolymer resin (ABS resin), fluorine resin, polyamide, polyethylene, polyethylene terephthalate, polyvinylidene chloride, polyvinyl chloride, polycarbonate, polystyrene, polysulfone, polypropylene, and liquid crystal polymer, thermosetting resins such as epoxy resin, phenol resin, polyimide, polyurethane, bis-maleimide-triazine resin, modified polyphenylene ether, and cyanate ester, and UV-curable resins such as UV-curable epoxy resin and UV-curable acrylic resin. These resins may be modified with a functional group or may also be reinforced with, for example, glass fibers, aramid fibers, or other fiber.

The coating film formed on a metal surface using the coating film-forming composition of the present invention has excellent adhesion between the metal and a resin. Therefore, without additional layers therebetween, the resin member 20 can be directly joined onto the coating film 12 disposed on the metal member surface. In other words, when the coating film-forming composition of the present invention is used, without additional treatments, a metal-resin composite having high adhesion can be obtained by simply forming a coating film on a metal member surface, and joining a resin member directly thereonto.

Depending on the kind of resin material to be joined an adhesive layer made of a silane coupling agent or the like may be formed on the coating film 12. The coating film 12 formed on the metal surface has excellent adhesion to a resin. In addition, it also functions as an underlay for fixing an adhesive component, such as the silane coupling agent, to the metal surface. When an additional adhesive layer is disposed on the coating film formed on a metal surface using the coating film-forming composition of the present invention, the adhesion between the metal and a resin may be further improved.

Examples

Hereinafter, examples of the present invention will be described together with comparative examples. Incidentally, the present invention is not limited to the following examples.

[Preparation of Test Copper Foil]

An electrolytic copper foil (3EC-III manufactured by Mitsui Mining & Smelting Co., Ltd., thickness: 35 µm) cut to 100 mm×100 mm was immersed and shaken in a 6.25 wt % sulfuric acid solution at normal temperature for 20 seconds to perform a derusting treatment, then rinsed with water, and dried to give a test copper foil (test piece).

[Preparation of Solution]

Each component was dissolved in ion exchange water to adjust blending quantity (concentrations) shown in Table 1, and then 1.0 N hydrochloric acid or a 1.0 N aqueous sodium hydroxide solution was added to make the pH shown in Table 1, thereby preparing a solution.

The silane coupling agent A is an imidazole-based silane coupling agent represented by the following formula, and a commercially available product (JX Metal IS1000) was used. In the following formula, $R^1$ to $R^4$ are each an alkyl group, and n is an integer of 1 to 3.

The silane coupling agent B is N,N'-bis(2-aminoethyl)-6-(3-triethoxysilylpropyl)amino-1,3,5-triazine-2,4-diamine represented by the following formula, and was synthesized in accordance with Example 1 of WO 2013/186941.

The silane coupling agent C is 5-(3-trimethoxysilylpropylsulfanyl)-4H-1,2,4-triazol-3-amine represented by the following formula, and was synthesized in accordance with Reference Example 1-2 of JP 2016-56449 A.

The silane coupling agent D is N-(1H-imidazol-2-ylmethyl)-3-trihydroxysilyl-propan-1-amine represented by the following formula, and was synthesized in accordance with Reference Example 1 of JP 2015-214743 A.

The silane coupling agent E is N-phenyl-3-aminopropyltrimethoxysilane represented by the following formula, and a commercially available product (Shin-Etsu Silicone KBM-573) was used.

The silane coupling agent F is N-(2-aminoethyl)-3-aminopropyltrimethoxysilane represented by the following formula, and a commercially available product (Shin-Etsu Silicone KBM-603) was used.

The "melamine-based compound" is a compound represented by the following formula, and was synthesized in the following synthesis example.

<Synthesis Example of Melamine-Based Compound>

To a THF solution of anhydrous ethylenediamine (1.5 mol) maintained at 50 to 55° C., a THF solution of cyanuric chloride (0.1 mol) was added dropwise. Subsequently, the mixture was allowed to react for 3 hours at 50 to 55° C. and then cooled to 20° C. An aqueous sodium hydroxide solution and isopropyl alcohol were added to the reaction solution, and the solvent was distilled off. Subsequently, dehydrated ethanol was added, and the precipitated sodium chloride was separated by filtration. The ethanol and ethylenediamine were distilled off from the filtrate, thereby giving a syrup-like reaction product.

[Evaluation]

<Coating Film Formability>

In Levels 1 to 3, a test piece was immersed in the solution (25° C.) of Table 1 within 24 hours after preparation for 15 seconds (Level 1), 30 seconds (Level 2), or 60 seconds (Level 3), then taken out from the solution and immediately rinsed with water, and subsequently dried. In Level 4, a test piece was immersed for 30 seconds in the solution (25° C.) of Table 1 within 24 hours after preparation, taken out from the solution and drained, air-dried at room temperature for 3 minutes, then rinsed with water, and dried. With respect to the sample of each level, changes in color tone were visually checked, and also the presence of an organic constituent-derived peak was checked with the infrared absorption (reflection absorption) spectrum. When a change in color tone was seen on the copper foil surface, and also an organic component-derived peak was confirmed, such a sample was rated as having a coating film formed thereon.

Based on the above evaluation results, the film formability of the solution was ranked into the following five classes.

A: Coating film was formed in all Levels 1 to 4.
B: Coating film formed in Levels 2 to 4, but not formed in Level 1.
C: Coating film formed in Levels 3 and 4, but not formed in Levels 1 and 2.
D: Coating film was formed in Level 4, but not formed in Levels 1 to 3.
E: No coating film was formed in all Levels 1 to 4.

<Adhesion>

On the test piece subjected to the coating film formation treatment in Level 3 (immersion time: 60 seconds) above, a solder resist ink was screen-printed, and UV light having an integrated light intensity of 1750 mJ was applied to photo-cure the resist. Subsequently, heating was performed at 120° C. for 30 minutes and further at 170° C. for 90 minutes to heat-cure the resist. A cut line (10 mm in width×70 mm in length) was made in the copper foil of the test piece after the resist is cured. The copper foil at the end portion of the cut portion was held with a gripper, and subjected to a 90° peel test at a peeling rate of 60 mm/min for a length of 60 mm in accordance with JIS C 6481 to measure the peel strength.

<Solution Stability>

A solution that had exhibited a peel strength of 0.1 N/mm or more in the above adhesion test was allowed to stand in a thermostat at 50° C. for 10 days. Subsequently, the same adhesion evaluation (peel test) as above was performed, and the peel strength retention rate relative to the case of using a solution immediately after preparation was determined.

Table 1 shows the compositions of the solutions and evaluation results of Examples and Comparative Examples.

TABLE 1

| | Composition | | | | Adhesion (peel strength) | | |
| --- | --- | --- | --- | --- | --- | --- | --- |
| | Component Name | Amount (wt %) | pH | Film Formability | Using solution immediately after preparation (N/mm) | Using solution after storage at 50° C. × 10 days (N/mm) | Retention rate (%) |
| Example 1 | Aminotriazole | 0.5 | 4.0 | C | 0.56 | 0.48 | 86% |
| | Malic acid | 2 | | | | | |
| | NaClO | 0.2 | | | | | |
| | Sodium chloride | 0.3 | | | | | |
| Example 2 | Melamine-based compound | 1 | 9.0 | B | 0.63 | 0.51 | 81% |
| | Adipic acid | 0.1 | | | | | |
| | NaClO | 0.5 | | | | | |
| | Sodium chloride | 1 | | | | | |
| Example 3 | Melamine-based compound | 1 | 9.0 | C | 0.42 | 0.35 | 83% |
| | Adipic acid | 0.1 | | | | | |
| | NaClO | 0.5 | | | | | |
| Example 4 | Silane coupling agent A | 0.4 | 5.0 | A | 0.72 | 0.69 | 96% |
| | Succinic acid | 0.5 | | | | | |
| | NaClO$_2$ | 0.2 | | | | | |
| | Sodium chloride | 0.3 | | | | | |
| Example 5 | Silane coupling agent B | 0.4 | 6.0 | A | 0.77 | 0.78 | 101% |
| | Maleic acid | 0.15 | | | | | |
| | NaClO$_2$ | 0.2 | | | | | |
| Example 6 | Silane coupling agent B | 0.05 | 7.0 | B | 0.65 | 0.64 | 98% |
| | Malonic acid | 0.01 | | | | | |
| | NaClO$_2$ | 0.05 | | | | | |
| | Sodium chloride | 0.4 | | | | | |
| Example 7 | Silane coupling agent B | 0.3 | 6.0 | B | 0.6 | 0.48 | 80% |
| | Malonic acid | 0.2 | | | | | |
| | Ammonium persulfate | 0.8 | | | | | |
| | Sodium chloride | 0.2 | | | | | |
| Example 8 | Silane coupling agent C | 0.2 | 7.0 | A | 0.71 | 0.79 | 111% |
| | Malonic acid | 0.05 | | | | | |
| | Citric acid | 0.05 | | | | | |
| | NaClO$_2$ | 0.2 | | | | | |
| Example 9 | Silane coupling agent C | 0.4 | 7.0 | C | 0.39 | 0.32 | 82% |
| | Malic acid | 0.3 | | | | | |
| | Sodium percarbonate | 0.4 | | | | | |
| | Sodium chloride | 0.1 | | | | | |
| Example 10 | Silane coupling agent D | 5 | 8.0 | B | 0.82 | 0.72 | 88% |
| | Maleic acid | 0.05 | | | | | |
| | 35% Hydrogen peroxide | 0.1 | | | | | |
| Example 11 | Silane coupling agent E | 1 | 10.0 | C | 0.48 | 0.41 | 85% |
| | Citric acid acid | 0.3 | | | | | |
| | 35% Hydrogen peroxide | 0.2 | | | | | |
| | Sodium chloride | 0.3 | | | | | |
| Comparative Example 1 | Silane coupling agent F | 2 | 46.0 | E | <0.05 | — | |
| | Citric acid | 0.2 | | | | | |
| | NaClO | 0.2 | | | | | |
| | Sodium chloride | 0.5 | | | | | |
| Comparative Example 2 | Melamine-based compound | 0.5 | 47.0 | C | 0.12 | <0.05 | <42% |
| | Acetic acid | 0.3 | | | | | |
| | NaClO | 0.2 | | | | | |
| | Sodium chloride | 1 | | | | | |
| Comparative Example 3 | Silane coupling agent A | 1 | 48.0 | D | 0.08 | — | |
| | Malonic acid | 0.1 | | | | | |
| | Sodium chloride | 1 | | | | | |
| Comparative Example 4 | Silane coupling agent D | 0.4 | 43.0 | B | 0.43 | 0.21 | 49% |
| | Maleic acid acid | 0.5 | | | | | |
| | NaClO$_2$ | 0.2 | | | | | |
| Comparative Example 5 | Silane coupling agent C | 2 | 12.0 | A | 0.51 | <0.05 | <10% |
| | Adipic acid | 0.15 | | | | | |
| | 35% Hydrogen peroxide | 0.2 | | | | | |
| | Sodium chloride | 0.3 | | | | | |

As shown in Table 1, in all of Examples 1 to 11, as a result of immersion within 60 seconds, a coating film was formed on the metal surface even when air-drying was not performed. In Comparative Example 1 where a silane coupling agent F having no aromatic ring was used, no coating film was formed even when air-drying was performed after immersion, and the adhesion between the test piece and the resist after the treatment was insufficient. In Comparative Example 3 where a solution containing the same silane coupling agent as in Example 4 and containing no oxidizing agent was used, although a coating film was formed in the case where air-drying was performed after immersion for 30 seconds (Level 4), no coating film was formed with immersion only (Levels 1 to 3). These results show that a coating film can be formed on a metal surface by using a solution containing a specific aromatic compound, and also that the coating film formation is promoted when an oxidizing agent is contained in the solution, and a coating film having excellent adhesion to a resin can be formed by immersion in the solution only.

In Comparative Example 2 using the same melamine-based compound as in Example 2, although the film formability was excellent, the adhesion between the test piece and the resist after the treatment was insufficient. This is presumably because as a result of using no polybasic acid and using acetic acid which is a monocarboxylic acid, the adhesion between the coating film and the resin did not sufficiently improve.

In Example 2, a coating film was formed as a result of immersion in the solution for 30 seconds (Level 2). Meanwhile, in Example 3 where no halide ion was contained, although a coating film was formed as a result of immersion for 60 seconds (Level 3), no coating film was formed as a result of immersion for 30 seconds. These results show that when a halide ion is contained in the solution in addition to an oxidizing agent, coating film formation on a metal surface is further promoted.

In Comparative Examples 4 and 5, in the case where a solution within 24 hours after preparation was used, the film formability was excellent, and the adhesion to a resist was also excellent. However, in the case where a solution after storage at 50° C. for 10 days was used, the adhesion strength to a resist significantly decreased. Meanwhile, in Examples 1 to 11, even in the case where a solution after storage at 50° C. for 10 days was used, as compared with the case of using a solution within 24 hours after preparation, 80% or more of the adhesion strength was retained. The pH is low in Comparative Example 4, while the pH is high in Comparative Example 5; thus, the stability of the oxidizing agent in the solution is low, and the film formability decreased with time after the preparation of the solution. In contrast, it can be seen that in the Examples, the solution has excellent film formability, and the solution stability is also high.

The invention claimed is:

1. A method for producing a surface-treated metal member, comprising bringing a coating film-forming composition into contact with a surface of a metal member, thereby forming a coating film on the surface of the metal member, wherein
    the coating film-forming composition comprising: an aromatic compound having an amino group and an aromatic ring in one molecule; a polybasic acid having two or more carboxy groups; and at least one oxidizing agent selected from the group consisting of hypochlorous acid, chlorous acid, chloric acid, perchloric acid, persulfuric acid, percarbonic acid, hydrogen peroxide, organic peroxides, and salts thereof, and
    the coating film-forming composition is a solution of pH 4 to 10.

2. The method according to claim 1, wherein after the coating film-forming composition is brought into contact with the surface of the metal member, the surface of the metal member is rinsed within 2 minutes.

3. The method according to claim 1, wherein the metal member is copper or a copper alloy.

4. A method for producing a metal-resin composite, comprising forming a coiting film on a surface of a metal member by the method according to claim 1, and then joining a resin member onto the coating film.

5. The method according to claim 1, wherein a content of the halide ion in the coating film-forming composition is 5 to 600 mM.

6. The method according to claim 1, wherein the aromatic compound has a silanol group or an alkoxysilyl group.

7. The method according to claim 1, wherein a content of the oxidizing agent in the coating film-forming composition is 0.01 to 0.9 wt%.

8. A coating film-forming composition that is capable of forming a coating film on a metal surface for improving adhesion to a resin,
    the composition comprising:
        an aromatic compound having, in one molecule,
            an amino group,
            a silanol group or an alkoxysilyl group, and
            an aromatic ring;
        a polybasic acid having two or more carboxy groups; and
        at least one oxidizing agent selected from the group consisting of hypochlorous acid, chlorous acid, chloric acid, perchloric acid, persulfuric acid, percarbonic acid, hydrogen peroxide, organic peroxides, and salts thereof, and the coating film-forming composition is a solution of pH 4 to 10.

9. The coating film-forming composition according to claim 8, wherein a content of the oxidizing agent is 0.01 to 0.9 wt%.

10. A coating film-forming composition that is capable of forming a coating film on a metal surface for improving adhesion to a resin,
    the composition comprising: an aromatic compound having an amino group and an aromatic ring in one molecule; a polybasic acid having two or more carboxy groups; and at least one oxidizing agent selected from the group consisting of hypochlorous acid, chlorous acid, chloric acid, perchloric acid, persulfuric acid, percarbonic acid, hydrogen peroxide, organic peroxides, and salts thereof, and
    the coating film-forming composition is a solution of pH 4 to 10, and a content of the oxidizing agent is 0.01 to 0.9 wt%.

11. The coating film-forming composition according to claim 10, wherein the aromatic ring of the aromatic compound is a nitrogen-containing aromatic ring.

12. The coating film-forming composition according to claim 10, wherein the aromatic compound has a primary amino group or a secondary amino group.

13. The coating film-forming composition according to claim 10, wherein the aromatic compound has a silanol group or an alkoxysilyl group.

14. The coating film-forming composition according to claim 10, wherein the polybasic acid is a divalent carboxylic acid.

* * * * *